(12) United States Patent
Kim et al.

(10) Patent No.: US 9,373,429 B2
(45) Date of Patent: Jun. 21, 2016

(54) METHOD OF OBTAINING GRAPHENE

(71) Applicant: HANWHA TECHWIN CO., LTD., Changwon-si (KR)

(72) Inventors: Na-young Kim, Changwon (KR); Jae-Chul Ryu, Changwon (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days.

(21) Appl. No.: 14/352,739

(22) PCT Filed: Oct. 18, 2012

(86) PCT No.: PCT/KR2012/008509
§ 371 (c)(1),
(2) Date: Apr. 18, 2014

(87) PCT Pub. No.: WO2013/058559
PCT Pub. Date: Apr. 25, 2013

(65) Prior Publication Data
US 2014/0246401 A1    Sep. 4, 2014

(30) Foreign Application Priority Data
Oct. 20, 2011    (KR) .................. 10-2011-0107579

(51) Int. Cl.
*C03C 15/00*    (2006.01)
*C03C 25/68*    (2006.01)
(Continued)

(52) U.S. Cl.
CPC ............. *H01B 13/0026* (2013.01); *B01J 23/02* (2013.01); *B01J 23/10* (2013.01); *B01J 23/22* (2013.01); *B01J 23/26* (2013.01); *B01J 23/28* (2013.01);
(Continued)

(58) Field of Classification Search
USPC .......................................... 216/92
See application file for complete search history.

(56) References Cited

U.S. PATENT DOCUMENTS
4,961,817 A  *  10/1990  Seki ......................... 156/751
2010/0101710 A1    4/2010  Choi et al.
(Continued)

FOREIGN PATENT DOCUMENTS
KR    10-2011-046863 A    5/2011
KR    10-2011-0052300 A    5/2011
(Continued)

OTHER PUBLICATIONS

International Search Report (PCT/ISA/210), dated Mar. 8, 2013, issued by the International Searching Authority in counterpart International Patent Application No. PCT/KR2012/008509.
(Continued)

*Primary Examiner* — Nadine Norton
*Assistant Examiner* — Thomas Pham
(74) *Attorney, Agent, or Firm* — Sughrue Mion, PLLC

(57) ABSTRACT

According to an aspect of an exemplary embodiment, there is provided a method of obtaining graphene, the method comprising: preparing a graphene forming structure of which a first graphene is formed on one surface and a second graphene is formed on another surface, and that comprises at least one metal catalyst member; disposing a first carrier and a second carrier on the first graphene and the second graphene, respectively; and removing the metal catalyst member by applying an etchant to a side surface of the graphene forming structure while winding up the first carrier and the second carrier by respectively rotating a pair of rolls formed to face each other.

10 Claims, 3 Drawing Sheets

(51) Int. Cl.
| | |
|---|---|
| B44C 1/22 | (2006.01) |
| C23F 1/00 | (2006.01) |
| C25F 3/00 | (2006.01) |
| H01B 13/00 | (2006.01) |
| B01J 23/755 | (2006.01) |
| C23C 16/26 | (2006.01) |
| C23C 16/54 | (2006.01) |
| C01B 31/04 | (2006.01) |
| B01J 23/02 | (2006.01) |
| B01J 23/10 | (2006.01) |
| B01J 23/22 | (2006.01) |
| B01J 23/26 | (2006.01) |
| B01J 23/28 | (2006.01) |
| B01J 23/30 | (2006.01) |
| B01J 23/34 | (2006.01) |
| B01J 23/42 | (2006.01) |
| B01J 23/46 | (2006.01) |
| B01J 23/52 | (2006.01) |
| B01J 23/72 | (2006.01) |
| B01J 23/745 | (2006.01) |
| B01J 23/75 | (2006.01) |
| H01B 1/04 | (2006.01) |
| B82Y 30/00 | (2011.01) |
| B82Y 40/00 | (2011.01) |

(52) U.S. Cl.
CPC ........... *B01J 23/30* (2013.01); *B01J 23/34* (2013.01); *B01J 23/42* (2013.01); *B01J 23/464* (2013.01); *B01J 23/52* (2013.01); *B01J 23/72* (2013.01); *B01J 23/745* (2013.01); *B01J 23/75* (2013.01); *B01J 23/755* (2013.01); *B82Y 30/00* (2013.01); *B82Y 40/00* (2013.01); *C01B 31/0446* (2013.01); *C01B 31/0453* (2013.01); *C23C 16/26* (2013.01); *C23C 16/545* (2013.01); *H01B 1/04* (2013.01)

(56) References Cited

U.S. PATENT DOCUMENTS

| | | | |
|---|---|---|---|
| 2011/0108521 A1 | 5/2011 | Woo et al. | |
| 2012/0258311 A1* | 10/2012 | Hong et al. | 428/408 |
| 2014/0120270 A1* | 5/2014 | Tour et al. | 427/596 |

FOREIGN PATENT DOCUMENTS

| | | |
|---|---|---|
| KR | 10-2011-0064164 A | 6/2011 |
| KR | 10-1138141 B1 | 4/2012 |
| WO | 2011/046415 A2 | 4/2011 |
| WO | 2011/087301 A2 | 7/2011 |

OTHER PUBLICATIONS

Written Opinion (PCT/ISA/237), dated Mar. 8, 2013, issued by the International Searching Authority in counterpart International Patent Application No. PCT/KR2012/008509.

* cited by examiner

METHOD OF OBTAINING GRAPHENE

CROSS-REFERENCE TO RELATED PATENT APPLICATION

This application claims the benefit of Korean Patent Application No. 10-2011-0107579, filed on Oct. 20, 2011, in the Korean Intellectual Property Office, the disclosure of which is incorporated herein in its entirety by reference.

BACKGROUND

1. Field

Exemplary embodiments relate to a method of obtaining graphene, and more particularly, to a method of obtaining graphene formed in a graphene forming structure.

2. Description of the Related Art

Recently, carbon materials including fullerenes formed of carbon, carbon nanotubes, graphene, graphite, or the like have been spotlighted.

In particular, research into carbon nanotubes and graphene has been actively performed. In this regard, large-scale formation of graphene is possible, the graphene may be electrically, mechanically, and chemically stable, and have excellent conductivity, and thus graphene is highlighted as a base material for an electronic circuit.

Recently, technology for large-scale manufacturing of graphene has been developed, and a study "Large-scale pattern growth of graphene films for stretchable transparent electrodes" published in the journal Nature on Jan. 14, 2009 (refer to Nature 07719) discloses a graphene manufacturing process using chemical vapor deposition (CVD).

A general graphene manufacturing process using CVD is described below.

First, a silicon wafer having a silicon oxide ($SiO_2$) layer is prepared. Then, a metal catalyst including nickel (Ni), copper (Cu), aluminum (Al), iron (Fe), or the like is deposited on the $SiO_2$ layer by using a sputtering device, an e-beam evaporator, or the like, and by doing so, a metal catalyst layer is formed.

Next, the silicon wafer on which the metal catalyst layer is formed, and a gas such as $CH_4$, $C_2H_2$, $C_2H_4$, CO, or the like including carbon are put into a reactor for inductive coupled plasma CVD (ICP-CVD), and then heated. Thus, carbon is absorbed into the metal catalyst layer. Finally, graphene is grown by performing a rapid cooling operation to separate carbon from the metal catalyst layer and to crystallize the carbon.

SUMMARY

One or more exemplary embodiments provide a method of obtaining graphene, performed to effectively obtain graphene from a graphene forming structure.

According to an aspect of an exemplary embodiment, there is provided a method of obtaining graphene, the method comprising: preparing a graphene forming structure of which a first graphene is formed on one surface and a second graphene is formed on another surface, and that comprises at least one metal catalyst member; disposing a first carrier and a second carrier on the first graphene and the second graphene, respectively; and removing the metal catalyst member by applying an etchant to a side surface of the graphene forming structure while winding up the first carrier and the second carrier by respectively rotating a pair of rolls formed to face each other.

The graphene forming structure may comprise one metal catalyst member, the first graphene may be formed on the one surface of the metal catalyst member, and the second graphene may be formed on the other surface of the metal catalyst member.

The graphene forming structure may comprise two metal catalyst members and an intermediate member disposed between the two metal catalyst members, wherein the first graphene may be formed on one surface of one of the two metal catalyst members, and the second graphene may be formed on one surface of the other one of the two metal catalyst members.

The metal catalyst member may comprise at least one of nickel (Ni), cobalt (Co), iron (Fe), platinum (Pt), gold (Au), aluminum (Al), chromium (Cr), Cu, magnesium (Mg), manganese (Mn), molybdenum (Mo), rhodium (Rh), silicon (Si), tantalum (Ta), titanium (Ti), tungsten (W), uranium (U), vanadium (V), and zirconium (Zr).

The metal catalyst member may have a plate shape.

The metal catalyst member may have a foil shape.

The first and second carriers may be formed of a flexible material.

The first and second carriers may be formed of a thermal release tape with an adhesive surface on at least one surface thereof.

In the removing of the metal catalyst member, the etchant may be applied to the side surface of the graphene forming structure by spraying.

The etchant may comprise at least one of acid, hydrogen fluoride (HF), buffered oxide etch (BOE), a ferric chloride ($FeCl_3$) solution, a ferric nitrate ($Fe(No_3)_3$) solution, a copper chloride ($CuCl_2$) solution, and a hydrogen peroxide-sulfuric acid ($H_2O_2$—$H_2SO_4$) solution.

In the removing of the metal catalyst member, the one pair of rolls may be rotated in opposite directions.

The method of obtaining graphene may further comprise separating the first graphene and the second graphene from the first carrier and the second carrier respectively.

BRIEF DESCRIPTION OF THE DRAWINGS

The above and other aspects will become more apparent by describing in detail exemplary embodiments thereof with reference to the attached drawings in which.

DETAILED DESCRIPTION OF THE EXEMPLARY EMBODIMENTS

Figure 1:
FIG. 1 is a cross-sectional view of a graphene forming structure, according to an exemplary embodiment.

The exemplary embodiments will be described more fully with reference to the accompanying drawings. Like reference numerals in the drawings denote like elements having substantially the same configurations, and thus their descriptions will not be repeated. Also, a thickness and a size of each component may be exaggerated for clarity.

Description about Method of Obtaining Graphene According to an Exemplary Embodiment Hereinafter, a method of obtaining graphene will be described with reference to FIGS. 1 to 5.

First, a graphene forming structure 100 in which a first graphene 121 and a second graphene 122 are respectively formed on both surfaces of a metal catalyst member 110 is prepared (operation S110).

FIG. 1 is a cross-sectional view of the graphene forming structure 100 according to an exemplary embodiment. Here, the term "graphene forming structure" refers to a structure in which graphene is sufficiently grown by using a chemical vapor deposition (CVD) process described above in the "Description of the Related Art". That is, the graphene forming structure 100 according to the present embodiment includes the first and second graphene 121 and 122 that are fully grown to be used but have not been transferred yet. The graphene forming structure 100 includes the metal catalyst member 110, and the first graphene 121 and the second graphene 122 that are respectively formed on both surfaces of the metal catalyst member 110.

Figure 2:
FIG. 2 is a cross-sectional view of a metal catalyst member, according to an exemplary embodiment.
Figure 3:
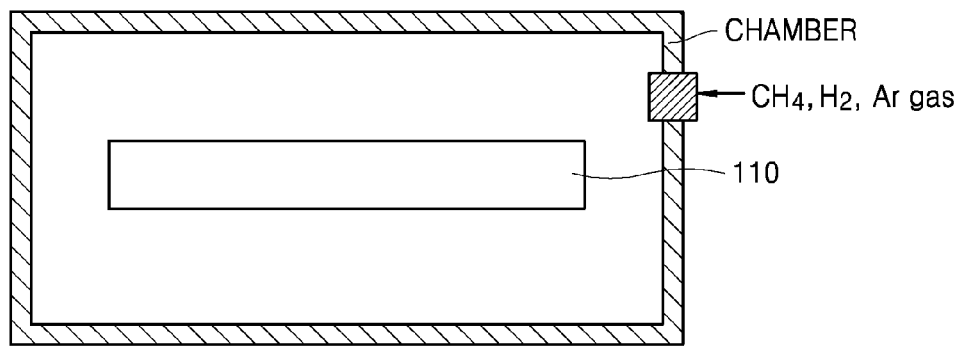
FIG. 3 is a view showing the metal catalyst member of FIG. 2 disposed inside a chamber to grow graphene in the metal catalyst member.

FIG. 2 is a cross-sectional view of the metal catalyst member 110, according to an exemplary embodiment. FIG. 3 is a view showing the metal catalyst member 110 of FIG. 2 disposed inside a chamber to grow graphene in the metal catalyst member 100.

In order to prepare the graphene forming structure 100, a manufacturer prepares the metal catalyst member 110 as shown in FIG. 2. The metal catalyst member 110 is formed of copper (Cu) and has a foil shape.

In the current embodiment, although the metal catalyst member 110 is formed of Cu, the exemplary embodiment is not limited thereto. In other words, the metal catalyst member 110 may be formed of any material that may grow graphene by absorbing carbon when performing CVD, and thus the material for forming the metal catalyst member 110 is not particularly limited. That is, the metal catalyst member 110 may be formed of a material including nickel (Ni), cobalt (Co), iron (Fe), platinum (Pt), gold (Au), aluminum (Al), chromium (Cr), Cu, magnesium (Mg), manganese (Mn), molybdenum (Mo), rhodium (Rh), silicon (Si), tantalum (Ta), titanium (Ti), tungsten (W), uranium (U), vanadium (V), zirconium (Zr), or a combination thereof.

Also, although the metal catalyst member 110 has a foil shape, the exemplary embodiment is not limited thereto. In other words, the shape of the metal catalyst member 110 is not particularly limited. However, in order to easily form graphene on both surfaces facing each other, the metal catalyst member 110 may have a plate shape, and particularly, a thin foil shape.

Next, as shown in FIG. 3, a gas such as $CH_4$, $C_2H_2$, $C_2H_4$, CO, or the like including carbon is put into a chamber for CVD or ICP-CVD, and then the gas is heated to about 300 to 2000□ so that the carbon is absorbed into the metal catalyst member 110.

Then, the metal catalyst member 110 is rapidly cooled at a speed of about 30° C./min to about 600° C./min to separate the carbon from the metal catalyst member 110 and crystallize the carbon, and then the first graphene 121 and the second graphene 122 are grown on both surfaces of the metal catalyst member 110, thereby preparing the graphene forming structure 100 as shown in FIG. 1. Here, the first graphene 121 and the second graphene 122 grown on both surfaces of the metal catalyst member 110 have an extremely thin plate or film shape configured as a single-layered structure or a multi-layered structure by covalent bonds.

Meanwhile, the first graphene 121 and the second graphene 122 may be grown by using a method different from the method described above. For example, graphene may be obtained in a short time by rapid thermal CVD (RT-CVD) or may be obtained by dissolving graphite by means of an E-beam.

In the above description, a process of preparing the graphene forming structure 100 in which the first graphene 121 and the second graphene 122 are formed on the both surfaces of the metal catalyst member 110 has been described.

Figure 4:
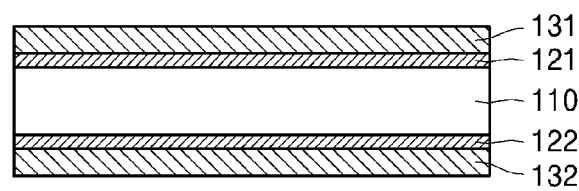
FIG. 4 is a view showing a graphene forming structure in which a first carrier and a second carrier are disposed, according to an exemplary embodiment.

Hereinafter, a process of disposing a first carrier 131 and a second carrier 132 on the first graphene 121 and the second graphene 122, respectively, will be described with reference to FIG. 4 (operation S120).

The first carrier 131 and the second carrier 132 are formed of a flexible thermal release tape. The thermal release tape may be one currently selling on the market, and the thermal release tape has an adhesive surface on one surface thereof. Thus, an operator disposes the first carrier 131 and the second carrier 132 on the first graphene 121 and the second graphene 122, respectively, by using a manual or automatic apparatus. In other words, the first graphene 121 and the second graphene 122 are disposed to be respectively adhered to adhesive surfaces of the first carrier 131 and the second carrier 132.

In the current embodiment, although the first carrier 131 and the second carrier 132 are formed of the thermal release tape, the exemplary embodiment is not limited thereto. In other words, materials and shapes of the first carrier 131 and the second carrier 132 are not particularly limited. That is, the first carrier 131 and the second carrier 132 may be formed of any material that does not damage surfaces of the first graphene 121 and the second graphene 122 or that minimizes damage to the surfaces of the first graphene 121 and the second graphene 122 when the first carrier 131 and the second carrier 132 are attached/detached to/from the first graphene 121 and the second graphene 122, respectively, and the first carrier 131 and the second carrier 132 may be formed of any flexible material.

Figure 5:
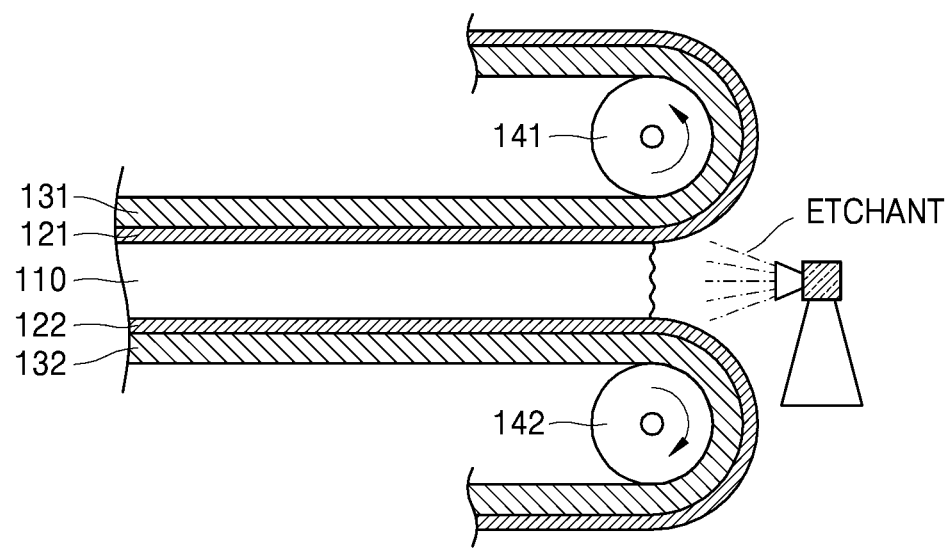
FIG. 5 is a view showing a process of removing the metal catalyst member by applying an etchant to a side surface of a graphene forming structure while winding up a first carrier and a second carrier around a pair of rolls, according to an exemplary embodiment.

Then, as shown in FIG. 5, an etchant is applied to a side surface of the graphene forming structure 100 while winding up the first carrier 131 and the second carrier 132 by rotating a pair of rolls 141 and 142, respectively, and thus the metal catalyst member 110 is removed (operation S130). Here, the rolls 141 and 142 are disposed to face each other at one side of the graphene forming structure 100. Also, one side surface where the etchant reaches among side surfaces of the graphene forming structure 100 is near to the rolls 141 and 142.

In detail, since the rolls 141 and 142 are rotated in opposite directions, the first carrier 131 and the second carrier 132 respectively wound around the rolls 141 and 142 are moved in directions away from each other. Thus, a force to separate the first graphene 121 from the metal catalyst member 110 is exerted on the first graphene 121, and a force to separate the second graphene 122 from the metal catalyst member 110 is exerted on the second graphene 122.

Here, the etchant is applied to the side surface of the graphene forming structure 100 to remove the metal catalyst member 110. In other words, the metal catalyst member 110 is etched and removed by using the etchant, and at the same time, the metal catalyst member 110 is separated from the first graphene 121 and the second graphene 122. Then, both the first carrier 131 and the first graphene 121 are moved by the rotation of the roll 141, and both the second carrier 132 and the second graphene 122 are moved by the rotation of the roll 142.

Here, the rolls 141 and 142 may use a mechanical configuration used in a conventional roll-to-roll process.

Also, the etchant used in operation S130 may be acid, hydrogen fluoride (HF), buffered oxide etch (BOE), a ferric chloride ($FeCl_3$) solution, a ferric nitrate ($Fe(No_3)_3$) solution, a copper chloride ($CuCl_2$) solution, a hydrogen peroxide-sulfuric acid ($H_2O_2$—$H_2SO_4$) solution, or a general solution capable of removing a metal catalyst. In other words, any material that minimally damages the first graphene 121 and the second graphene 122 and may effectively remove the metal catalyst member 110 may be used as the etchant.

Also, although the etchant may be applied to the side surface of the graphene forming structure 100 by spraying in operation S130, any method of applying the etchant to effectively remove the metal catalyst member 110 may be used. For example, a method of partially soaking the graphene forming structure 100 in the etchant may be used.

As described above, according to the current embodiment, the first graphene 121 and the second graphene 122 formed in the graphene forming structure 100 may be effectively obtained.

In other words, according to the current embodiment, the first graphene 121 and the second graphene 122 may be obtained by applying the etchant to the side surface of the graphene forming structure 100 to simultaneously etch and separate the metal catalyst member 110, and thus the process of obtaining the first graphene 121 and the second graphene 122 may be simplified, and also manufacturing costs may be reduced.

Also, according to the current embodiment, the first graphene 121 and the second graphene 122 disposed on both surfaces of the graphene forming structure 100 may be simultaneously obtained, and thus a large amount of graphene may be produced.

In the current embodiment, the process of obtaining graphene is finished when the first graphene 121 and the second graphene 122 are respectively adhered to the first carrier 131 and the second carrier 132. In other words, a user who wishes to use the graphene later may transfer the first and second graphene 121 and 122 respectively adhered to the first and second carriers 131 and 132 to a final object (for example, a circuit board) by applying heat to the first and second carriers 131 and 132 to separate the first and second carriers 131 and 132 from the first and second graphene 121 and 122.

In the current embodiment, although the process of obtaining graphene is finished when the first graphene 121 and the second graphene 122 are respectively adhered to the first carrier 131 and the second carrier 132, the exemplary embodiment is not limited thereto. In other words, the operator may separate the first graphene 121 and the second graphene 122 from the first carrier 131 and the second carrier 132, respectively, after the process is finished, and then may further perform a process of extracting the first graphene 121 and the second graphene 122.

Description of Method of Obtaining Graphene According to Another Exemplary Embodiment Hereinafter, a method of transferring graphene will be described with reference to FIGS. 6 to 8.

First, a graphene forming structure 200 including a first metal catalyst member 211, a second metal catalyst member 212, an intermediate member 213, a first graphene 221 formed on one surface of the first metal catalyst member 211, and a second graphene 222 formed on one surface of the second metal catalyst member 212 is prepared (operation S210).

Figure 6:
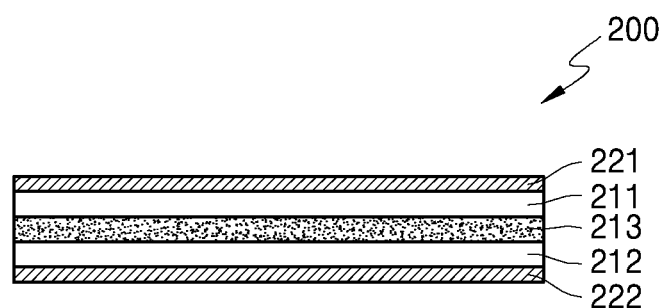
FIG. 6 is a cross-sectional view of a graphene forming structure, according to another exemplary embodiment.
Figure 7:
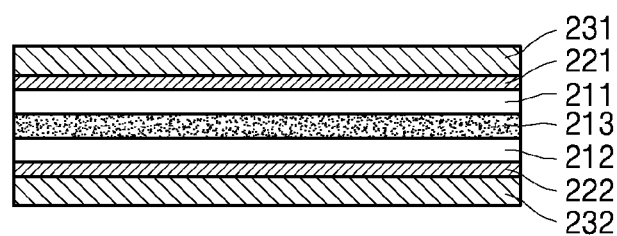
FIG. 7 is a cross-sectional view showing a graphene forming structure in which a first carrier and a second carrier are disposed, according to another exemplary embodiment.

FIG. 6 is a cross-sectional view of a graphene forming structure 200, according to another exemplary embodiment. The graphene forming structure 200 has a different structure from the graphene forming structure 100 of the previous embodiment. In the current embodiment, the graphene forming structure 200 includes the first metal catalyst member 211, the second metal catalyst member 212, the intermediate member 213 interposed between the first metal catalyst member 211 and the second metal catalyst member 212, the first graphene 221 formed on the one surface of the first metal catalyst member 211, and the second graphene 222 formed on the one surface of the second metal catalyst member 212.

The first metal catalyst member 211 and the second metal catalyst member 212 are formed of Cu and have a foil shape.

In the current embodiment, although the first metal catalyst member 211 and the second metal catalyst member 212 are formed of Cu, the exemplary embodiment is not limited thereto. In other words, the first metal catalyst member 211 and the second metal catalyst member 212 may be formed of any material that may grow graphene by absorbing carbon when performing CVD, and thus the material for forming the first metal catalyst member 211 and the second metal catalyst member 212 is not particularly limited. That is, the first metal catalyst member 211 and the second metal catalyst member 212 may be formed of a material including Ni, Co, Fe, Pt, Au, Al, Cr, Cu, Mg, Mn, Mo, Rh, Si, Ta, Ti, W, U, V, Zr, or a combination thereof.

Also, although the first metal catalyst member 211 and the second metal catalyst member 212 have a foil shape, the exemplary embodiment is not limited thereto. However, in order to easily form graphene on both surfaces facing each other, the first metal catalyst member 211 and the second metal catalyst member 212 may have a plate shape, and particularly, a thin foil shape.

The intermediate member 213 is formed of a material including Cr, but the exemplary embodiment is not limited thereto. In other words, any material that is capable of being located between the first and second metal catalyst members 211 and 212 to couple them together may be used to form the intermediate member 213, and thus the material of the intermediate member 213 is not particularly limited. For example, a double-sided adhesive tape may be used as the intermediate member 213.

Meanwhile, a method of forming the first graphene 221 and the second graphene 222 on the one surfaces of the first metal catalyst member 211 and the second metal catalyst member 212, respectively, is practically the same as the method of forming the first graphene 121 and the second graphene 122 on both surfaces of the metal catalyst member 110 in the previous embodiment, and thus a detailed description thereof will be omitted here.

Next, a process of disposing the first carrier 231 and the second carrier 232 on the first graphene 221 and the second graphene 122, respectively, will be described with referent to FIG. 7 (operations S220).

The first carrier 231 and the second carrier 232 are formed of a flexible thermal release tape. The thermal release tape may be one currently selling on the market, and the thermal release tape has an adhesive surface on one surface thereof. Thus, an operator disposes the first carrier 231 and the second carrier 232 on the first graphene 221 and the second graphene 222, respectively, by using a manual or automatic apparatus. In other words, the first graphene 221 and the second graphene 222 are disposed to be respectively adhered to adhesive surfaces of the first carrier 231 and the second carrier 232.

In the current embodiment, although the first carrier 231 and the second carrier 232 are formed of the thermal release tape, the exemplary embodiment is not limited thereto. In other words, materials and shapes of the first and second carriers 231 and 232 are not particularly limited. That is, the first and second carriers 231 and 232 may be formed of any material that does not damage surfaces of the first graphene 221 and the second graphene 222 or that minimizes damage to the surfaces of the first graphene 221 and the second graphene 222 when the first and second carriers 231 and 232 are attached/detached to/from the first graphene 221 and the second graphene 222, respectively, and the first and second carriers 231 and 232 may be formed of any flexible material.

Figure 8:
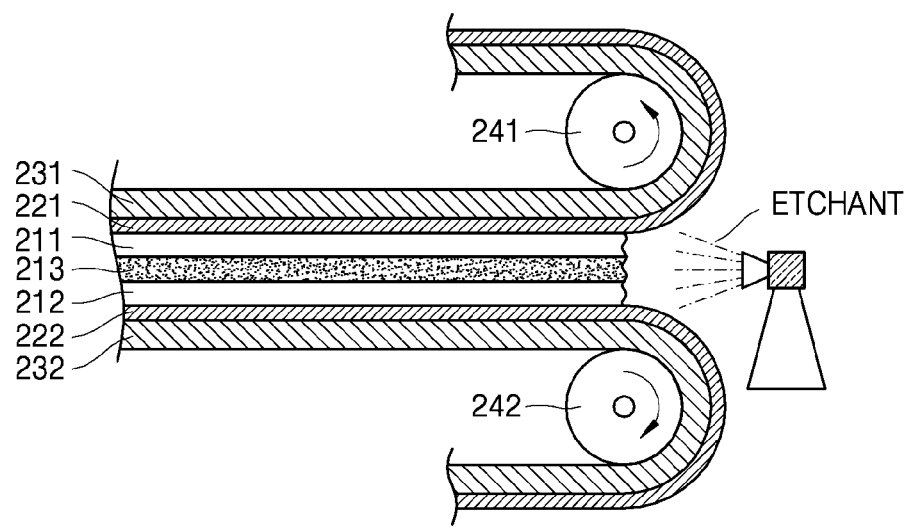
FIG. 8 is a view showing a process of removing a metal catalyst member by applying an etchant to a side surface of the graphene forming structure while winding up a first carrier and a second carrier around a pair of rolls, according to another exemplary embodiment.

Then, as shown in FIG. 8, an etchant is applied to a side surface of the graphene forming structure 200 while winding up the first carrier 231 and the second carrier 232 by rotating a pair of rolls 241 and 242, respectively, and thus, the metal catalyst member 210 is removed (operation S230). Here, the rolls 241 and 242 are disposed to face each other at one side of the graphene forming structure 200. Also, one side surface where the etchant reaches among side surfaces of the graphene forming structure 200 is near to the rolls 241 and 242.

In detail, since the rolls 241 and 242 are rotated in opposite directions, the first carrier 231 and the second carrier 232 respectively wound around the rolls 241 and 242 are moved in directions away from each other. Thus, a force to separate the first graphene 221 from the first metal catalyst member 211 is exerted on the first graphene 221, and a force to separate the second graphene 222 from the second metal catalyst member 212 is exerted on the second graphene 222.

Here, the etchant is applied to the side surface of the graphene forming structure 200 to remove the first metal catalyst member 211, the second metal catalyst member 212, and the intermediate member 213. In other words, the first metal catalyst member 211, the second metal catalyst member 212, and the intermediate member 213 are etched and removed by using the etchant, and at the same time, the first metal catalyst member 211 and the second metal catalyst member 212 are separated from the first graphene 221 and the second graphene 222, respectively. Then, both the first carrier 231 and the first graphene 221 are moved by the rotation of the roll 241, and both the second carrier 232 and the second graphene 222 are moved by the rotation of the roll 242.

Here, the rolls 241 and 242 may use a mechanical configuration used in a conventional roll-to-roll process.

Also, the etchant used in operation S230 may be acid, HF, BOE, a $FeCl_3$ solution, a $Fe(No_3)_3$ solution, a $CuCl_2$ solution, a $H_2O_2$—$H_2SO_4$ solution, or a general solution capable of removing a metal catalyst. In other words, any material that minimally damages the first graphene 221 and the second graphene 222 and may effectively remove the first metal catalyst member 211 and the second metal catalyst member 212 may be used as the etchant.

Also, although the etchant may be applied to the side surface of the graphene forming structure 200 by spraying in operation S230, any method of applying the etchant to effectively remove the metal catalyst member 210 may be used. For example, a method of partially soaking the graphene forming structure 200 in the etchant may be used.

Also, in operation S230, the first metal catalyst member 211, the second metal catalyst member 212, and the intermediate member 213 are simultaneously removed by using the etchant, but the exemplary embodiment is not limited thereto. In other words, according to the exemplary embodiment, the intermediate member 213 may be removed by using a separate etchant, or may not be removed. Here, even when the intermediate member 213 is not removed, the first metal catalyst member 211 and the second metal catalyst member 212 respectively adhered to the first graphene 221 and the second graphene 222 are removed, and thus there is no difficulty in obtaining the first graphene 221 and the second graphene 222.

As described above, according to the current embodiment, the first graphene 221 and the second graphene 222 formed in the graphene forming structure 200 including the intermediate member 213 may be effectively obtained.

In other words, according to the current embodiment, the first graphene 221 and the second graphene 222 may be obtained by applying the etchant to the side surface of the graphene forming structure 200 to simultaneously etch and separate the first metal catalyst member 211 and the second metal catalyst member 212, and thus the process of obtaining the first graphene 221 and the second graphene 222 may be simplified, and also manufacturing costs may be reduced.

Also, according to the current embodiment, the first graphene 221 and the second graphene 222 disposed on both surfaces of the graphene forming structure 200 may be simultaneously obtained, and thus a large amount of graphene may be produced.

In the current embodiment, the process of obtaining graphene is finished when the first graphene 221 and the second graphene 222 are respectively adhered to the first carrier 231 and the second carrier 232. In other words, a user who wishes to use the graphene later may transfer the first and second graphene 221 and 222 respectively adhered to the first and second carriers 231 and 232 to a final object (for example, a circuit board) by applying heat to the first and second carriers 231 and 232 to separate the first and second carriers 231 and 232 from the first and second graphene 221 and 222.

In the current embodiment, although the process of obtaining graphene is finished when the first graphene 221 and the second graphene 222 are respectively adhered to the first carrier 231 and the second carrier 232, the exemplary embodiment is not limited thereto. In other words, the operator may separate the first graphene 221 and the second graphene 222 from the first carrier 231 and the second carrier 232, respectively, after the process is finished, and then may further perform a process of extracting the first graphene 221 and the second graphene 222.

Meanwhile, in the exemplary embodiments, graphene obtained by using the method according to the exemplary embodiments may be used in various fields such as a transparent electrode, a conductive thin film, a radiating or heating device, a flexible display apparatus, a touch screen, an organic light-emitting diode (LED), or a dye-sensitized solar cell electrode.

According to one or more embodiments, graphene may be effectively obtained from a graphene forming structure on both surfaces of which the graphene is formed.

The exemplary embodiments may be used with respect to technology for obtaining graphene.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of obtaining graphene, the method comprising:
preparing a graphene forming structure of which a first graphene is formed on one surface and a second graphene is formed on another surface, and that comprises two metal catalyst members and an intermediate member disposed between the two metal catalyst members;
disposing a first carrier and a second carrier on the first graphene and the second graphene, respectively; and
removing the two metal catalyst members by applying an etchant to a side surface of the graphene forming structure while winding up the first carrier and the second carrier by respectively rotating a pair of rolls formed to face each other,
wherein the first graphene is formed on one surface of one of the two metal catalyst members, and the second graphene is formed on one surface of the other one of the two metal catalyst members.

2. The method of claim 1, wherein the first and second carriers are formed of a flexible material.

3. The method of claim 2, wherein the first and second carriers are formed of a thermal release tape with an adhesive surface on at least one surface thereof.

4. The method of claim 1, wherein the two metal catalyst members comprise at least one of nickel (Ni), cobalt (Co), iron (Fe), platinum (Pt), gold (Au), aluminum (Al), chromium (Cr), Cu, magnesium (Mg), manganese (Mn), molybdenum (Mo), rhodium (Rh), silicon (Si), tantalum (Ta), titanium (Ti), tungsten (W), uranium (U), vanadium (V), and zirconium (Zr).

5. The method of claim 1, wherein the two metal catalyst members have a plate shape.

6. The method of claim 1, wherein the two metal catalyst members have a foil shape.

7. The method of claim 1, wherein in the removing of the two metal catalyst members, the etchant is applied to the side surface of the graphene forming structure by spraying.

8. The method of claim 1, wherein the etchant comprises at least one of acid, hydrogen fluoride (HF), buffered oxide etch (BOE), a ferric chloride (FeCl3) solution, a ferric nitrate (Fe(No3)3) solution, a copper chloride (CuCl2) solution, and a hydrogen peroxide-sulfuric acid (H2O2-H2SO4) solution.

9. The method of claim 1, wherein in the removing of the two metal catalyst members, the one pair of rolls are rotated in opposite directions.

10. The method of claim 1, further comprising separating the first graphene and the second graphene from the first carrier and the second carrier respectively.

* * * * *